US011270905B2

(12) United States Patent
Venkatasubramanian et al.

(10) Patent No.: US 11,270,905 B2
(45) Date of Patent: Mar. 8, 2022

(54) MODULATING FILM PROPERTIES BY OPTIMIZING PLASMA COUPLING MATERIALS

(71) Applicant: Applied Materials, Inc., Santa Clara, CA (US)

(72) Inventors: Eswaranand Venkatasubramanian, Santa Clara, CA (US); Edward L. Haywood, Santa Clara, CA (US); Samuel E. Gottheim, Santa Clara, CA (US); Pramit Manna, Santa Clara, CA (US); Kien N. Chuc, Cupertino, CA (US); Adam Fischbach, Campbell, CA (US); Abhijit B. Mallick, Fremont, CA (US); Timothy J. Franklin, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 130 days.

(21) Appl. No.: 16/913,969

(22) Filed: Jun. 26, 2020

(65) Prior Publication Data
US 2021/0005500 A1    Jan. 7, 2021

Related U.S. Application Data (60) Provisional application No. 62/869,470, filed on Jul. 1, 2019.

(51) Int. Cl.
*H01L 21/687* (2006.01)
*H01L 21/67* (2006.01)
(Continued)

(52) U.S. Cl.
CPC .. *H01L 21/68721* (2013.01); *H01J 37/32715* (2013.01); *H01L 21/32139* (2013.01); *H01L 21/67276* (2013.01); *H01J 2237/3321* (2013.01)

(58) Field of Classification Search
CPC ......... H01L 21/68721; H01L 21/32139; H01L 21/67276; H01J 37/32715
See application file for complete search history.

(56) References Cited

U.S. PATENT DOCUMENTS

| 4,783,368 A | 11/1988 | Yamamoto et al. |
| 5,352,493 A | 10/1994 | Dorfman et al. |

(Continued)

FOREIGN PATENT DOCUMENTS

| JP | 2010024476 A | 2/2010 |
| JP | 2018536287 A | 12/2018 |

(Continued)

OTHER PUBLICATIONS

International Search Report and Written Opinion dated Oct. 16, 2020 for Application No. PCT/US2020/039841.

(Continued)

*Primary Examiner* — Binh X Tran
(74) *Attorney, Agent, or Firm* — Patterson + Sheridan, LLP (57) ABSTRACT

Embodiments of the present disclosure generally relate to a substrate processing chamber, and components thereof, for forming semiconductor devices. The processing chamber comprises a substrate support, and an edge ring is disposed around the substrate support. The edge ring comprises a material selected from the group consisting of quartz, silicon, cross-linked polystyrene and divinylbenzene, polyether ether ketone, $Al_2O_3$, and AlN. The material of the edge ring is selected to modulate the properties of hardmask films (Continued)

deposited on substrates in the processing chamber. As such, hardmask films having desired film properties can be deposited in the processing chamber without scaling up the RF power to the chamber.

20 Claims, 5 Drawing Sheets (51) Int. Cl.
*H01L 21/3213* (2006.01)
*H01J 37/32* (2006.01)

(56) References Cited

U.S. PATENT DOCUMENTS

| | | |
|---|---|---|
| 5,378,316 A | 1/1995 | Franke et al. |
| 5,688,382 A | 11/1997 | Besen et al. |
| 5,942,854 A | 8/1999 | Ryoji et al. |
| 6,013,980 A | 1/2000 | Goel et al. |
| 6,320,295 B1 | 11/2001 | McGill et al. |
| 6,592,771 B1 | 7/2003 | Yamanaka et al. |
| 6,900,002 B1 | 5/2005 | Plat et al. |
| 7,166,336 B1 | 1/2007 | Mori et al. |
| 7,942,111 B2 | 5/2011 | Burger et al. |
| 8,105,660 B2 | 1/2012 | Tudhope et al. |
| 8,119,240 B2 | 2/2012 | Cooper |
| 8,361,906 B2 | 1/2013 | Lee et al. |
| 9,269,587 B2 | 2/2016 | Shimizu et al. |
| 9,695,593 B2 | 7/2017 | Vokey et al. |
| 10,249,495 B2 | 4/2019 | Yang et al. |
| 2003/0180459 A1 | 9/2003 | Redeker et al. |
| 2004/0026235 A1 | 2/2004 | Stowell |
| 2006/0183290 A1* | 8/2006 | Kamada ............... H01L 22/14 438/300 |
| 2006/0246290 A1 | 11/2006 | Oda et al. |
| 2006/0264063 A1 | 11/2006 | Stern et al. |
| 2007/0032081 A1* | 2/2007 | Chang ............... H01J 37/32623 438/689 |
| 2007/0104867 A1 | 5/2007 | Haba |
| 2007/0275569 A1 | 11/2007 | Moghadam et al. |
| 2008/0053819 A1 | 3/2008 | Hong et al. |
| 2008/0085604 A1 | 4/2008 | Hoshino et al. |
| 2008/0099326 A1 | 5/2008 | Ye et al. |
| 2008/0194169 A1 | 8/2008 | Sterling et al. |
| 2009/0047760 A1 | 2/2009 | Yamazaki et al. |
| 2009/0186206 A1 | 7/2009 | Ito et al. |
| 2009/0212010 A1 | 8/2009 | Wang et al. |
| 2011/0005681 A1 | 1/2011 | Savas et al. |
| 2011/0274852 A1 | 11/2011 | Ito et al. |
| 2012/0276743 A1 | 11/2012 | Won et al. |
| 2013/0146443 A1 | 6/2013 | Papa et al. |
| 2014/0054658 A1 | 2/2014 | Ma et al. |
| 2014/0170853 A1 | 6/2014 | Shamma et al. |
| 2014/0264931 A1* | 9/2014 | Wang ............... H01L 21/76801 257/774 |
| 2014/0345802 A1 | 11/2014 | Umehara et al. |
| 2015/0348824 A1 | 12/2015 | Kuenle et al. |
| 2015/0371851 A1 | 12/2015 | Lee et al. |
| 2016/0042961 A1 | 2/2016 | Dorf et al. |
| 2016/0053366 A1 | 2/2016 | Stowell et al. |
| 2016/0125589 A1* | 5/2016 | Tertitski ............... G06T 7/0004 382/151 |
| 2016/0179005 A1 | 6/2016 | Shamma et al. |
| 2016/0276134 A1 | 9/2016 | Collins et al. |
| 2016/0372307 A1 | 12/2016 | Yang et al. |
| 2017/0103893 A1 | 4/2017 | Kulshreshtha et al. |
| 2017/0263478 A1* | 9/2017 | McChesney ...... H01J 37/32623 |
| 2017/0372899 A1 | 12/2017 | Yang et al. |
| 2018/0096843 A1 | 4/2018 | Kulshreshtha et al. |
| 2018/0174838 A1* | 6/2018 | Ueda ............... C23C 16/5096 |
| 2019/0057839 A1 | 2/2019 | Kellogg et al. |
| 2019/0122889 A1 | 4/2019 | Kulshreshtha et al. |
| 2019/0228970 A1 | 7/2019 | Yang et al. |
| 2020/0066495 A1* | 2/2020 | Noorbakhsh ........ H01L 21/6831 |
| 2020/0185194 A1* | 6/2020 | Albarede ........... H01J 37/32183 |

FOREIGN PATENT DOCUMENTS

| | | |
|---|---|---|
| KR | 20110115291 A | 10/2011 |
| KR | 10-2012-0121340 A | 11/2012 |
| KR | 20170127724 A | 11/2017 |
| TW | 468209 B | 12/2001 |

OTHER PUBLICATIONS

International Search Report and the Written Opinion for International Application No. PCT/US2018/032684 dated Sep. 5, 2018.

Ban et al. "Diamond-like carbon films deposited by electron beam excited plasma chemical vapor deposition," Diamond and Related Materials, vol. 11, No. 7, Jul. 2002, pp. 1353-1359, <https://doi.org/10.1016/S0925-9635(01)00743-9>.

Ban et al. "Stress and structural properties of diamond-like carbon films deposited by electron beam excited plasma CVD," Diamond and Related Materials, vol. 12, No. 1, Jan. 2003, pp. 47-56, <https://doi.org/10.1016/S0925-9635(02)00265-0>.

Moushinho et al. "High density plasma chemical vapor deposition of diamond-like carbon films," Microelectronics Journal, vol. 34, Nos. 5-8, May-Aug. 2003, pp. 627-629, <https://doi.org/10.1016/S0026-2692(03)00065-X>.

* cited by examiner

MODULATING FILM PROPERTIES BY OPTIMIZING PLASMA COUPLING MATERIALS

CROSS-REFERENCE TO RELATED APPLICATIONS

This application claims benefit of U.S. provisional patent application Ser. No. 62/869,470, filed Jul. 1, 2019, which is herein incorporated by reference.

BACKGROUND

Field

Embodiments of the present disclosure generally relate to apparatus and methods utilized in the manufacture of semiconductor devices. More particularly, embodiments of the present disclosure relate to a substrate processing chamber, and components thereof, for forming semiconductor devices.

Description of the Related Art

Integrated circuits have evolved into complex devices that can include millions of transistors, capacitors, and resistors on a single chip. The evolution of chip designs continually involves faster circuitry and greater circuit density. The demands for faster circuits with greater circuit densities impose corresponding demands on the materials used to fabricate such integrated circuits. In particular, as the dimensions of integrated circuit components are reduced to the sub-micron scale, there is a trend to use low resistivity conductive materials as well as low dielectric constant insulating materials to obtain suitable electrical performance from such components.

The demands for greater integrated circuit densities also impose demands on the process sequences used in the manufacture of integrated circuit components. For example, in process sequences that use conventional photolithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer.

As the pattern dimensions are reduced, the thickness of the energy sensitive resist is correspondingly reduced in order to control pattern resolution. Such thin resist layers can be insufficient to mask underlying material layers during the pattern transfer process due to attack by the chemical etchant. An intermediate layer (e.g., silicon oxynitride, silicon carbine or carbon film), called a hardmask, is often used between the energy sensitive resist layer and the underlying material layers to facilitate pattern transfer because of greater resistance to the chemical etchant. Hardmask materials having both high etch selectivity and high deposition rates are often utilized. As critical dimensions (CD) decrease, current hardmask materials lack the desired etch selectivity relative to underlying materials (e.g., oxides and nitrides) and are often difficult to deposit. Furthermore, in order to modulate the properties of the hardmask, the RF power applied to the chamber must be scaled up, often improving one film property, such as film modulus, while decreasing another property, such as film stress.

Thus, what is needed in the art are improved methods and apparatus for fabricating semiconductor devices.

SUMMARY

Embodiments of the present disclosure generally relate to a substrate processing chamber, and components thereof, for forming semiconductor devices. The processing chamber comprises a substrate support, and an edge ring is disposed around the substrate support. The edge ring comprises a material selected from the group consisting of quartz, silicon, cross-linked polystyrene and divinylbenzene, polyether ether ketone, $Al_2O_3$, and AlN. The material of the edge ring is selected to modulate the properties of hardmask films deposited on substrates in the processing chamber. As such, hardmask films having desired film properties can be deposited in the processing chamber without scaling up the RF power to the chamber.

In one embodiment, a method for modulating properties of one or more hardmask films comprises depositing a first hardmask film on a first substrate and processing the first substrate at a first RF power, measuring one or more film properties of the first hardmask film, removing the first substrate from a substrate support, swapping a first edge ring in the substrate support for a second edge ring, the second edge ring comprising a material selected from the group consisting of quartz, silicon, cross-linked polystyrene and divinylbenzene, polyether ether ketone, $Al_2O_3$, and AlN, placing a second substrate on the substrate support, depositing a second hardmask film on the second substrate and processing the second substrate at the first RF power, and measuring the one or more film properties of the second hardmask film.

In another embodiment, a method for modulating properties of one or more hardmask films comprises depositing a first hardmask film on a first substrate and processing the first substrate at a first RF power, measuring one or more film properties of the first hardmask film, the one or more film properties comprising modulus and stress, removing the first substrate from a substrate support, swapping a first edge ring in the substrate support for a second edge ring, the first edge ring comprising a first material different than a second material of the second edge ring, placing a second substrate on the substrate support, and depositing a second hardmask film on the second substrate and processing the second substrate at the first RF power, wherein the second material of the second edge ring is selected to adjust at least one film property of the second hardmask film based on the measured one or more film properties of the first hardmask film.

In yet another embodiment, a non-transitory computer-readable medium having instructions that are configured to cause a system to deposit a first hardmask film on a first substrate and processing the first substrate at a first RF power, measure one or more film properties of the first hardmask film, remove the first substrate from a substrate support, swap a first edge ring in the substrate support for a second edge ring, the second edge ring comprising a material selected from the group consisting of quartz, silicon, cross-linked polystyrene and divinylbenzene, polyether ether ketone, $Al_2O_3$, and AlN, place a second substrate on the substrate support, deposit a second hardmask film on the second substrate and processing the second substrate at the first RF power, and measure the one or more film properties of the second hardmask film.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a substrate processing chamber, and components thereof, for forming semiconductor devices. The processing chamber comprises a substrate support, and an edge ring is disposed around the substrate support. The edge ring comprises a material selected from the group consisting of quartz, silicon, cross-linked polystyrene and divinylbenzene, polyether ether ketone, $Al_2O_3$, and AlN. The material of the edge ring is selected to modulate the properties of hardmask films deposited on substrates in the processing chamber. As such, hardmask films having desired film properties can be deposited in the processing chamber without scaling up the RF power to the chamber.

Embodiments of the present disclosure relate to a substrate processing chamber utilized in substrate processing in the manufacture of electronic devices. Substrate processing includes deposition processes, etch processes, as well as other low pressure, processes, plasma processes, thermal processes used to manufacture electronic devices on substrates. Examples of processing chambers and/or systems that may be adapted to benefit from exemplary aspects of the disclosure is the Producer® APF™ PECVD system commercially available from Applied Materials, Inc., located in Santa Clara, Calif. It is contemplated that other processing chambers and/or processing platforms, including those from other manufacturers, may be adapted to benefit from aspects of the disclosure.

Embodiments of the deposition chamber disclosed herein may be utilized for the fabrication of memory devices, and in particular, for the deposition of hardmasks utilized during fabrication of memory devices. Current memory devices are able to retain stored data for a very long period of time without applying a voltage thereto, and the reading rate of such memory devices is relatively high. It is relatively easy to erase stored data and rewrite data into the memory devices. Thus, memory devices have been widely used in micro-computers, and automatic control systems, etc. To increase the bit density and reduce the cost per bit of memory devices, 3D NAND (three-dimensional not AND) memory devices have been developed. Other memory devices, such as DRAM (dynamic random access memory), EM (expanded memory) and ReRAM (resistive random access memory), as well as advanced hardmask materials for forming the same, are also being developed to further facilitate advances in the semiconductor industry.

Vertical gate 3D memory cells are being explored for 3D NAND technologies to reduce cost as the number of memory cell layers increase. Oxide/silicon and oxide/nitride layer stacks are useful due to material integration advantages, but with an increasing number of memory cell layers, thickness of the layers becomes a limiting factor. Thus, while there is an interest in reducing the thickness of the memory cell layers, issues of oxide quality (i.e. breakdown voltage), silicon resistivity, and high aspect ratio etching persist with the reduced layer thickness.

Figure 1:
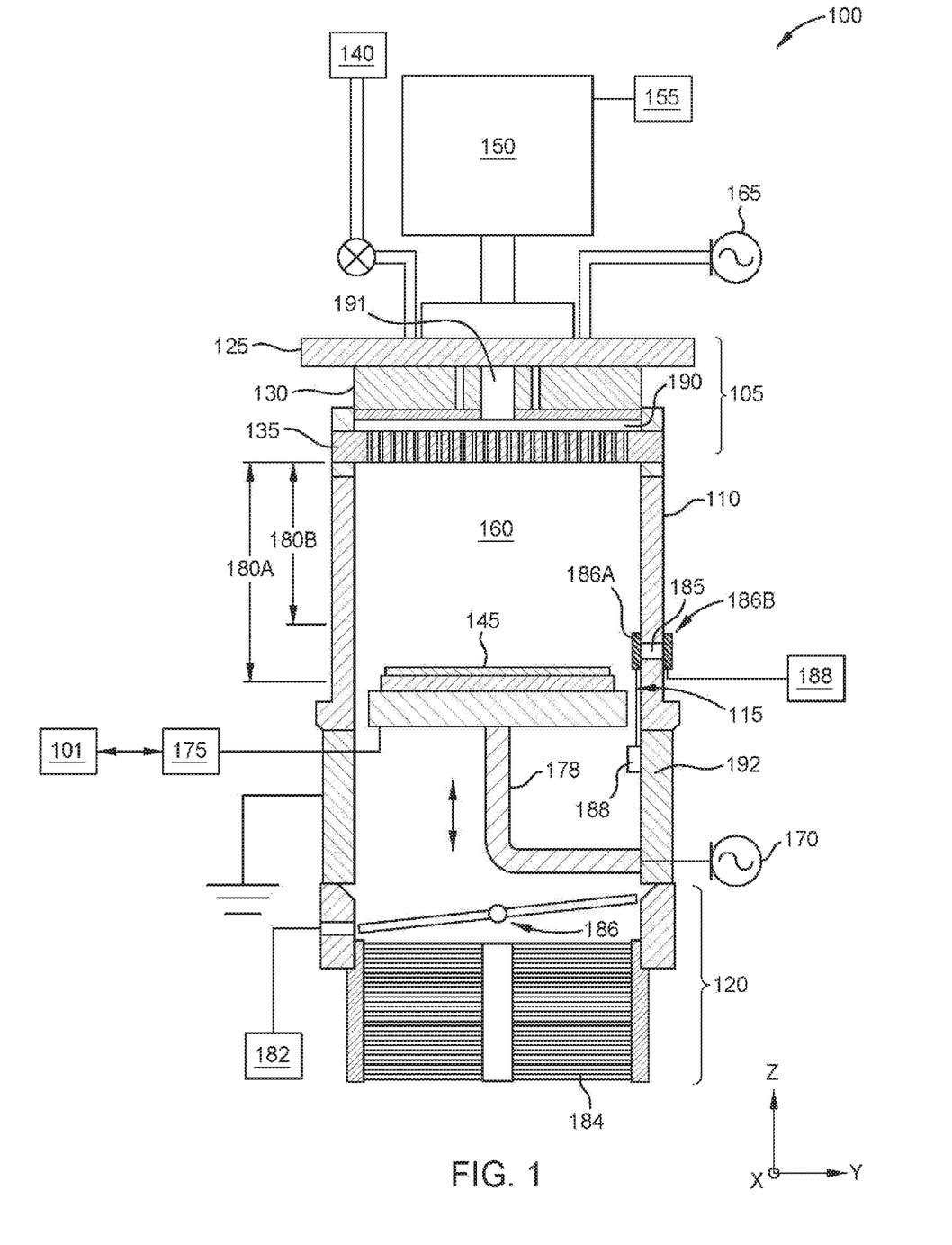
FIG. 1 is a schematic side cross sectional view of an illustrative processing chamber.

FIG. 1 is a schematic side cross sectional view of an illustrative processing chamber 100 suitable for conducting a deposition process. In one embodiment, the processing chamber 100 may be configured to deposit advanced patterning films onto a substrate, such as hardmask films, for example amorphous carbon hardmask films.

The processing chamber 100 includes a lid assembly 105, a spacer 110 disposed on a chamber body 192, a substrate support 115, a system controller 101, and a variable pressure system 120. The lid assembly 105 includes a lid plate 125 and a heat exchanger 130. In the embodiment shown, the lid assembly 105 also includes a showerhead 135. However, in other embodiments, the lid assembly 105 includes a concave or dome-shaped gas introduction plate.

The lid assembly 105 is coupled to a processing gas source 140. The processing gas source 140 contains precursor gases for forming films on a substrate 145 supported on the substrate support 115. As an example, the processing gas source 140 includes precursor gases such as carbon containing gases, hydrogen containing gases, helium, among others. In a specific example, the carbon containing gas includes acetylene ($C_2H_2$). The processing gas source 140 provides precursors gases to a plenum 190 disposed in the lid assembly 105. The lid assembly 105 includes one or more channels for directing precursor gases from the processing gas source 140 into the plenum 190. From the plenum, the precursor gases flow through the showerhead 135 into a processing volume 160.

The lid assembly 105 is also coupled to an optional remote plasma source 150. The remote plasma source 150 is coupled to a cleaning gas source 155 for providing cleaning gases to the processing volume 160 formed inside the spacer 110 between the lid assembly 105 and the substrate 145. In one example, cleaning gases are provided through a central conduit 191 formed axially through the lid assembly 105. In another example, cleaning gases are provided through the same channels which direct precursor gases. Example cleaning gases include oxygen-containing gases such as oxygen and/or ozone, as well fluorine containing gases such as $NF_3$, or combinations thereof.

In addition to or as an alternative to the remote plasma source 150, the lid assembly 105 is also coupled to a first or upper radio frequency (RF) power source 165. The first RF power source 165 facilitates maintenance or generation of plasma, such as a plasma generated from a cleaning gas. In one example, the remote plasma source 150 is omitted, and the cleaning gas is ionized into a plasma in situ via the first RF power source 165. The substrate support 115 is coupled to a second or lower RF power source 170. The first RF power source 165 may be a high frequency RF power source (for example, about 13.56 MHz or about 40 MHz) and the second RF power source 170 may be a low frequency RF power source (for example, about 2 MHz or about 13.56 MHz). It is to be noted that other frequencies are also contemplated. In some implementations, the second RF power source 170 is a mixed frequency RF power source, providing both high frequency and low frequency power. Utilization of a dual frequency RF power source, particularly for the second RF power source 170, improves film deposition. When utilizing a second RF power source 170 which provides dual frequency powers, such as 13.56 MHz and 40 MHz, the 13.56 MHz frequency improves implantation of species into the deposited film, which the 40 MHz frequency increases ionization and deposition rate of the film.

One or both of the first RF power source 165 and the second RF power source 170 are utilized in creating or maintaining a plasma in the processing volume 160. For example, the second RF power source 170 may be utilized during a deposition process and the first RF power source 165 may be utilized during a cleaning process (alone or in conjunction with the remote plasma source 150). In some deposition processes, the first RF power source 165 is used in conjunction with the second RF power source 170. During a deposition process, one or both of the first RF power source 165 and the second RF power source 170 provide a power of about 4 kilowatts (kW) to about 9 kW, such as about 4 kW to about 6 kW, in the processing volume 160 to facilitation ionization of a precursor gas.

The substrate support 115 is coupled to an actuator 175 that provides movement thereof in the Z direction. The substrate support 115 is also coupled to a facilities cable 178 that allows vertical movement of the substrate support 115 while maintaining communication with the second RF power source 170 as well as other power and fluid connections. The spacer 110 is disposed on the chamber body 192. A height of the spacer 110 allows movement of the substrate support 115 vertically within the processing volume 160. In one example, the substrate support 115 is movable from a first distance 180A to a second distance 180B relative to the lid assembly 105 (for example, relative to a lower surface of the showerhead 135). In some embodiments, the first distance 180A is about 14 inches and the second distance is about 11.2 inches. In contrast to conventional plasma enhanced chemical vapor deposition (PECVD) processes, the spacer 110 greatly increases the distance between (and thus the volume between) the substrate support 115 and the lid assembly 105. The increased distance between the substrate support 115 and the lid assembly 105 reduces collisions of ionized species in the process volume 160, resulting in deposition of film with less tensile stress. Films deposited with less tensile stress facilitate improved planarity (e.g., less bowing) of substrates upon which the film is formed. Reduced bowing of substrates results in improved precision of downstream patterning operations.

The variable pressure system 120 includes a first pump 182 and a second pump 184. The first pump 182 is a roughing pump that may be utilized during a cleaning process and/or substrate transfer process. A roughing pump is generally configured for moving higher volumetric flow rates and/or operating a relatively higher (though still sub-atmospheric) pressure. In one example, the first pump maintains a pressure within the processing chamber of about 300 mtorr to about 800 mtorr, such as about 400 torr to about 6 mtorr, during a clean process. Utilization of a roughing pump during clean operations facilitates relatively higher pressures and/or volumetric flow of cleaning gas (as compared to a deposition operation). The relatively higher pressure and/or volumetric flow during the cleaning operation improves cleaning of chamber surfaces.

The second pump 184 may be a turbo pump that is utilized during a deposition process. A turbo pump is generally configured to operate a relatively lower volumetric flow rate and/or pressure. For example, the tubular molecular pump is configured to maintain the processing region 160 of the process chamber at a pressure of less than about 10 mtorr, such about 5 mtorr or less, during a deposition process. The reduced pressure of the processing region 160 maintained during deposition facilitates deposition of a film having reduced tensile stress and/or increased $sp^2$-$sp^3$ conversion, when depositing carbon-based hardmasks. Thus, process chamber 100 is configured to utilize both relatively lower pressure to improve deposition and relatively higher pressure to improve cleaning.

In some embodiments, both of the first pump 182 and the second pump 184 are utilized during a deposition process. A valve 186 is utilized to control the conductance path to one or both of the first pump 182 and the second pump 184. The valve 186 also provides symmetrical pumping from the processing volume 160.

The processing chamber 100 also includes a substrate transfer port 185. The substrate transfer port 185 is selectively sealed by an interior door 186A and an exterior door 186B. Each of the doors 186A and 186B are coupled to actuators 188. The doors 186A and 186B facilitate vacuum sealing of the processing volume 160. The doors 186A and 186B also provide symmetrical RF application and/or plasma symmetry within the processing volume 160. In one example, at least the door 186A is formed of a material that facilitates conductance of RF power, such as stainless steel, aluminum, or alloys thereof.

The system controller 101 controls activities and operating parameters of the automated components found in the processing system 100. The system controller 101 may be independently coupled to one or more components in the processing system 100, such as the actuators 175, 188, the first RF power source 165, the second RF power source 170, and the processing gas source 140, for example. The system controller 101 is a general use computer that is used to control one or more components found in the processing system 100. The system controller 101 is generally designed to facilitate the control and automation of one or more of the processing sequences disclosed herein and typically includes a central processing unit (CPU) (not shown), memory (not shown), and support circuits (or I/O) (not shown). Software instructions and data can be coded and stored within the memory (e.g., non-transitory computer readable medium) for instructing the CPU. A program (or computer instructions) readable by the processing unit within the system controller determines which tasks are performable in the processing system. For example, the non-transitory computer readable medium includes a program which when executed by the processing unit are configured to perform one or more of the methods described herein. Preferably, the program includes code to perform tasks relating to monitoring, execution, and control of the movement, support, and/or positioning of a substrate along with the various process recipe tasks and various processing module process recipe operations being performed.

Figure 2:
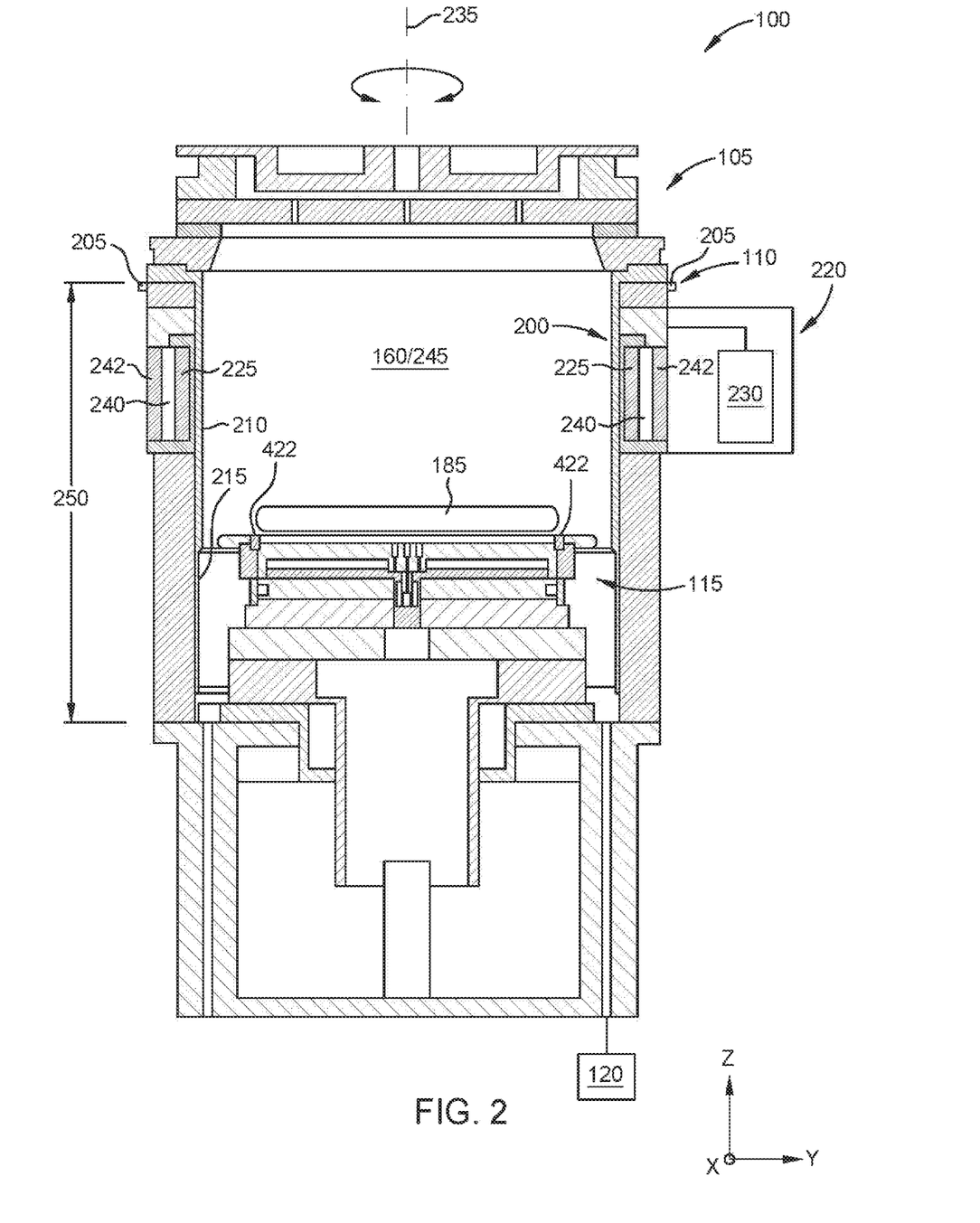
FIG. 2 is a schematic side view of the processing chamber of FIG. 1 rotated about 90 degrees.

FIG. 2 is a schematic side view of the processing chamber 100 of FIG. 1 rotated about 90 degrees. In FIG. 2, details of the spacer 110 are shown. The spacer 110 includes a liner 200 that surrounds the processing volume 160.

The spacer 110 also includes a plurality of heater elements 205 embedded in or in thermal communication with the body of the spacer 110. The heater elements 205 are utilized to maintain the temperature of the spacer 110 at about 80 degrees Celsius, or greater. Each of the heater elements 205 may be cartridge heaters.

The liner 200 includes an upper or first portion 210 and a lower or second portion 215. The first portion 210 has a thickness that is greater than a thickness of the second portion 215. The varied thickness provides many benefits. One benefit of the reduced thickness of the second portion 215 is increased space between the substrate support 115 and the interior wall of the spacer 110 thus increasing vacuum conductance. Another benefit of the reduced thickness of the second portion 215 is a change in thermal mass of the liner 200. Thus, parts of the liner 200 adjacent to or in the first portion 210 are maintained at a temperature that is greater than a temperature of parts of the liner 200 adjacent to or in the second portion 215. The liner 200 is formed from one or more materials including aluminum, titanium, or alloys thereof. In one example, the liner extends from the lid assembly 105, past the substrate support 115, and adjacent a bottom of the processing chamber 100. In such an example, the liner 200 may not contact the bottom of the chamber 100, but is instead spaced apart therefrom. In addition, while FIG. 2 illustrates a liner 200 as being a single member, it is contemplated that multiple liners may be utilized to line interior surfaces of the process chamber. For example, a first 9 or upper) liner may be utilized to line the spacer 110, while a second (or lower) liner may be used to line interior surfaces of the chamber body (shown in FIG. 1).

The spacer 110 also includes a magnet assembly 220. The magnet assembly 220 includes a plurality of magnets 225 that surround the spacer 110. Each of the magnets 225 are coupled to an actuator 230. The actuator 230 rotates the magnets 225 around the spacer 110 outside of the liner 200 about a longitudinal axis 235 of the processing chamber 100. The actuator 230 is also adapted to move the magnets 225 vertically (in the Z direction) along the longitudinal axis 235. Each of the magnets 225 may be permanent magnets, or electromagnets, or a combination thereof. Each of the magnets 225 are positioned within a cavity 240 formed in a sidewall 242 of the spacer 110. In one example, the magnets are positioned below the heater elements 205.

In some embodiments, about one half of the plurality of magnets 225 is oriented with the North pole facing the substrate support 115 (substantially parallel to the longitudinal axis 235). The other portion of the plurality of magnets 225 is oriented with the South pole facing the substrate support 115 (substantially parallel to the longitudinal axis 235). In one example, the plurality of magnets 225 is arranged in a circle about the spacer 110 (in-plane view). The plurality of magnets 225 are separated into a first portion or first semi-circle and a second portion or second semi-circle. Each of the magnets 225 in the first semi-circle is oriented with the North pole facing the substrate support 115 (substantially parallel to the longitudinal axis 235). Each of the magnets 225 in the second semi-circle is oriented with the South pole facing the substrate support 115 (substantially parallel to the longitudinal axis 235). In such an example, the plurality of magnets 225 may be rotated during deposition, or the plurality of magnets may remain stationary.

The magnet assembly 220 aids in plasma confinement and/or tuning in the processing volume 160. In one embodiment, the magnet assembly 220 also forms a resonance cavity 245 within the processing volume 160 during a deposition process. The resonance cavity 245 provides a magnetic flux that extends the plasma sheath vertically downward (Z direction) towards a substrate (not shown in FIG. 2). The magnet assembly 220 provides a B-field in an X/Y plane as well as in the Z direction. The magnet assembly 220 also allows tuning of the plasma within the processing volume 160 and/or the resonance cavity 245. Eddy currents in the plasma may be monitored to provide a metric for adjusting one or both of the position of the magnets 225 and the rotation speed of the magnets 225. Additionally or alternatively, metrology of films previously deposited on a substrate may be performed, and the results utilized to vary positions and/or rotation speed of the magnets 225. Thus, the resonance cavity 245 and the magnet assembly 220 provide better film uniformity on a substrate.

Figure 3:
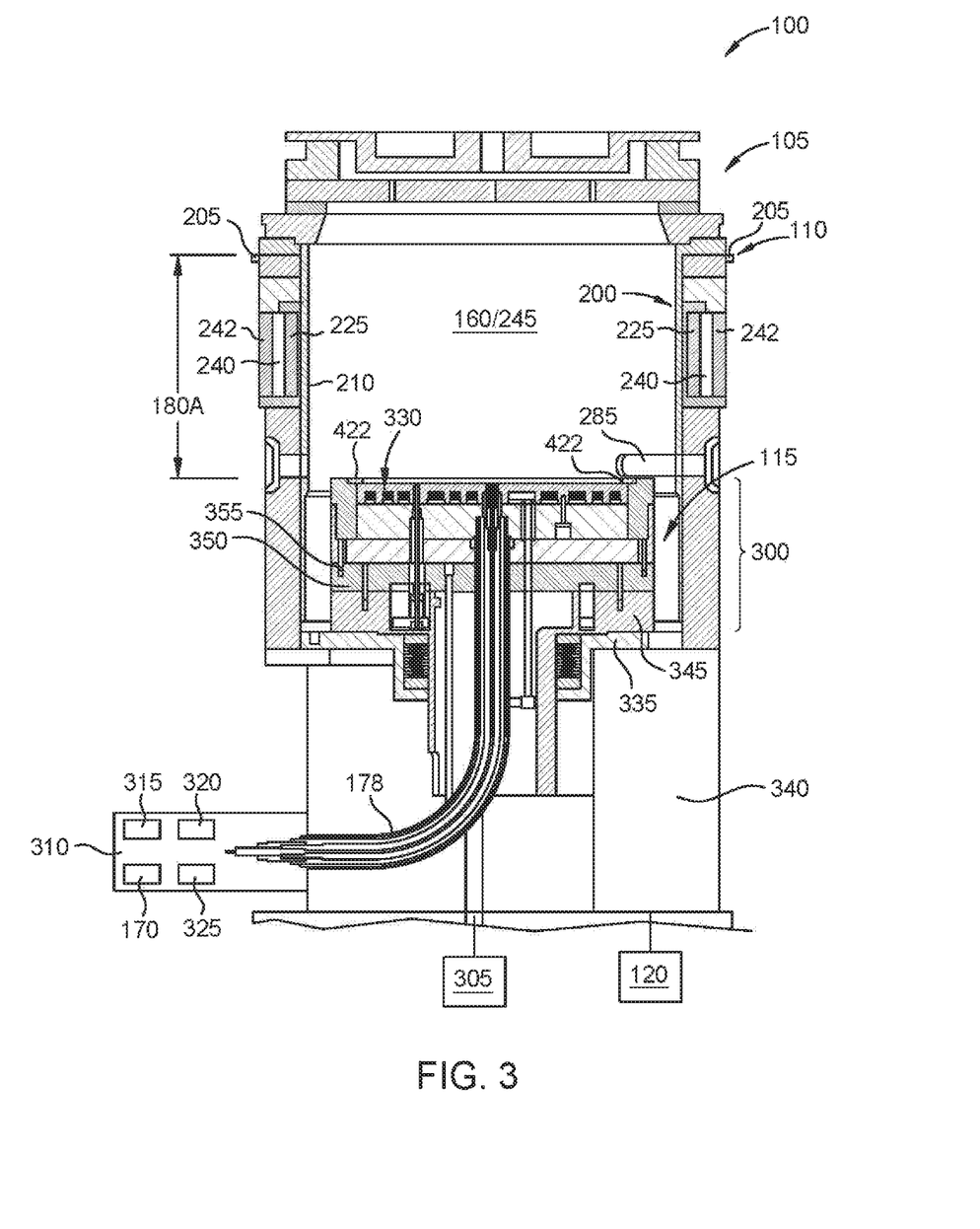
FIG. 3 is a schematic sectional view of the processing chamber.

FIG. 3 is a schematic sectional view of the processing chamber 100 comprising a cathode assembly 300, which includes the substrate support 115. The processing chamber 100 comprises an opening 285 for moving substrates, such as wafers, into and out of the processing chamber 100. The cathode assembly 300 is coupled to an actuator 305 (similar to actuator 175 shown in FIG. 1) that moves the cathode assembly 300 vertically in the Z direction. As shown in FIG. 3, the cathode assembly 300 in the lowermost position (e.g., the first distance 180A) relative to the lid assembly 105. The ability to adjust the position of the cathode assembly 300 for deposition processes allows an optimum film quality to be achieved.

The cathode assembly 300 also includes a facilities interface 310. The facilities interface 310 provides connections for RF power as well as other electrical and fluid connections. The facilities interface 310 is coupled to the substrate support 115 via the facilities cable 178. Other connections include a power source 315, a coolant source 320, and a gas supply 325.

The power source 315 is utilized to power an electrostatic chuck 330 that is part of the substrate support 115. The power source 315 may be a direct current (DC) power source. De-chucking is facilitated by a controller (not shown) that drains the electrostatic chuck 330. In addition, the facilities cable 178 is coupled to the power source 170, optionally through a matching network, to facilitate operations within the processing chamber 100. In one example, the facilities cable 178 facilities transfer of RF power during PECVD process. Due to the relatively large volume created by the spacer 110, and the pressures at which processing chamber 100 operated during a PECVD process, higher power levels (compared to conventional PECVD processes) are used to establish and maintain a plasma. For example, the facilities cable may carry about 4 kW of power to about 9 kW of power, at 110 amps, during a PECVD process. It is contemplated that amperage may be reduced to range of about 78 amps to about 80 amps, without film quality degradation, when utilizing magnets 225 in a tuned configuration.

The coolant source 320 contains a coolant that chills the substrate support 115. For example, a coolant that from the coolant source 320 is flowed to the substrate support 115 to maintain a temperature of the electrostatic chuck 330 (and/or a substrate positioned thereon) at about 0 degrees Celsius to about −10 degrees Celsius. The coolant includes a heat transfer fluid, for example heat transfer fluids sold under the tradename GALDEN®.

The gas supply 325 provides a fluid to a space below the electrostatic chuck 330 in order to prevent condensation. The fluid may be clean dry air, nitrogen (N₂), helium (He), or other suitable gas. The fluid supplied to the space below the electrostatic chuck reduces condensation onto the electrostatic, including lower surfaces thereof.

One or some of the combination of the cooling of the substrate support 115, the heated spacer 110 (using the heater elements 205 shown in FIG. 2) and the resonance cavity 235 as described herein provides many benefits. The low temperature of the substrate increases deposition rate as well as decreases substrate bow. Maintaining the temperature of the spacer 110 and/or the liner 200 to below about 100 degrees Celsius facilitates more efficient cleaning and/or minimizes adhesion of particles onto the liner 200. To facilitate cooling of liner 200, one or more cooling channels may be formed in the spacer 110.

Also shown in FIG. 3 is a support structure 335. While only one is shown, the support structure 335 has three vacuum channels 340 formed therein. The vacuum channels 340 are coupled to the variable pressure system 120. The vacuum channels 340 facilitate symmetrical pumping from the processing volume 160.

The cathode assembly 300 is coupled to a base ring 350 and an optional mounting plate 345. Fasteners 355 extend from the base ring 350 to secure the substrate support 115 thereon.

Figure 4:
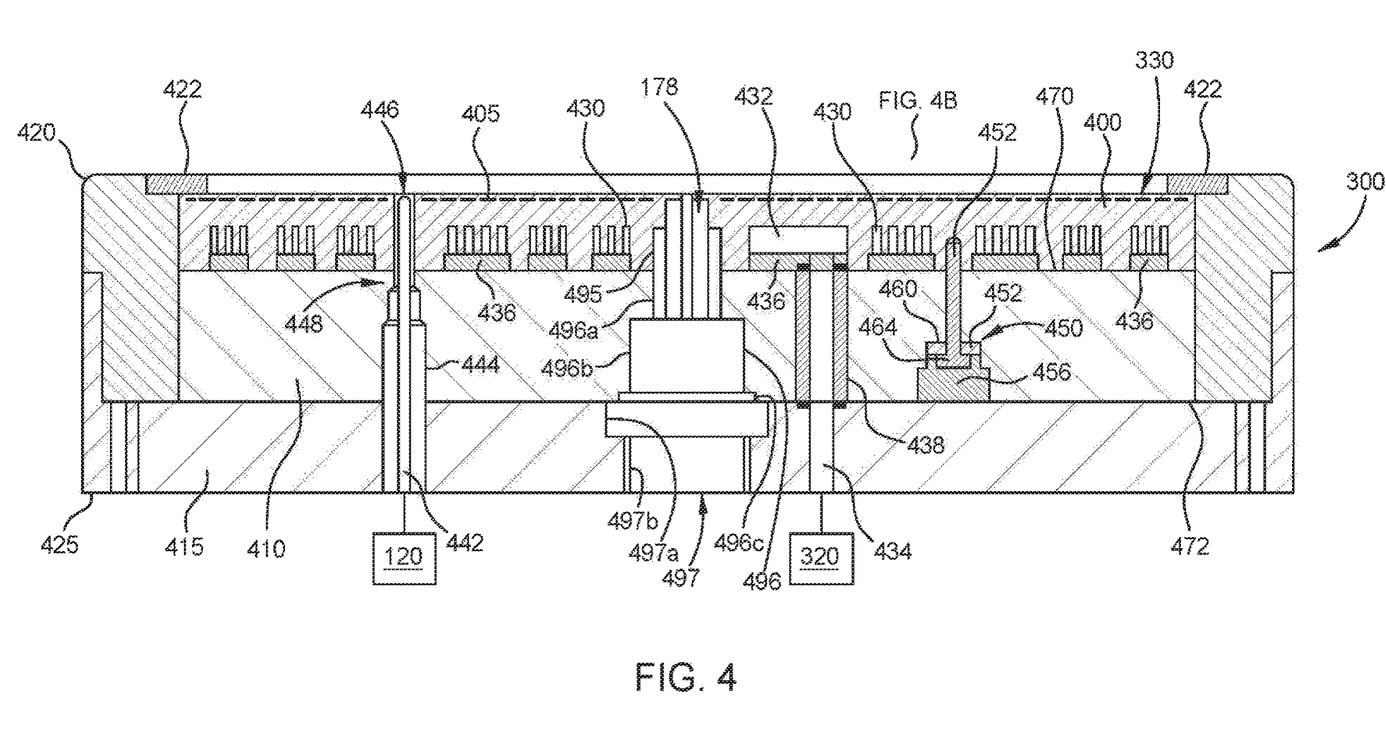
FIG. 4 is a schematic sectional view of one embodiment of the substrate support.

FIG. 4 is a schematic sectional view of one embodiment of the substrate support 115. As described above, the substrate support 115 includes an electrostatic chuck 330. The electrostatic chuck 330 includes a puck 400. The puck 400 includes one or more electrodes 405 embedded therein. A first electrode of the one or more electrodes 405 is utilized as a chucking electrode and a second electrode of the one or more electrodes 405 is utilized as an RF biasing electrode. The puck 400 is formed from a dielectric material, such as a ceramic material, for example aluminum nitride (AlN).

The puck 400 is supported by a dielectric plate 410 and a base plate 415. The dielectric plate 410 may be formed from an electrically insulative material, such as quartz, or a thermoplastic material, such as high performance plastics sold under the tradename REXOLITE®. The base plate 415 may be made from a metallic material, such as aluminum. During operation, the base plate 415 is coupled to ground or is electrically floating while the puck 400 is RF hot. An end of the facilities cable 178 is shown in openings formed in the puck 400, the dielectric plate 410 and the base plate 415. Power for the electrodes of the puck 400, as well as fluids from the gas supply 325 (shown in FIG. 3) to the substrate support 115, is provided by the facilities cable 178.

Each of the puck 400, the dielectric plate 410, and the base plate 415 include a respectively axially aligned opening formed therein or therethrough for accommodating the facilities cable 178. The puck 400 includes an opening 495 shaped to engage the facilities cable 178. For example, the opening 495 may be configured as a female receptacle for receiving the facilities cable 178. The dielectric plate 410 includes an opening 496 axially aligned with the opening 495. The opening 496 includes an upper portion 496a having a diameter about equal to the diameter of the opening 495, a middle portion 496b having a diameter with a diameter greater than the diameter of the upper portion, and a lower portion 496c having a diameter greater than a diameter of the middle portion 496b. The base plate 415 includes an opening 497 having an upper portion 497a with a first diameter and a lower portion 497b with a second diameter less than the first diameter. The multiple diameters the openings 496, 496, and 497 facilitate securing of the facilities cable 178 therein.

The puck 400 includes a plurality of fluid channels 430 formed therein. Each of the fluid channels 430 are in fluid communication with an inlet channel 432. The inlet channel 432 is fluidly coupled to an inlet conduit 434. The inlet conduit 434 is coupled to the coolant source 320. Each of the fluid channels 430 and the inlet channel 432 are sealed by a cap plate 436. The cap plates 436 may be made of the same material as the puck 400, or aluminum, and can be welded or otherwise bonded to the puck 400 to seal the fluid channels 430 and the inlet conduit 434. While not shown, an outlet conduit, similar to the inlet conduit 434, is provided in the substrate support 115 such that the cooling fluid can be recirculated therein.

A portion of the inlet conduit 434 is formed by a tubular member 438. The tubular member 438 is formed from a dielectric material such as ceramic materials. Seals 440 are provided at ends of the tubular member 438 adjacent to the cap plates 436 and the base plate 415. The tubular member 438 prevents arcing that may be caused by the cooling fluid flowing therethrough. The tubular member 438 may also thermally insulate the dielectric plate 410 from the relatively cold cooling fluid flowing therein in order to prevent cracking of the dielectric plate 410.

The substrate support 115 also includes a plurality of lift pins 442 (only one shown). Each of the lift pins 442 is movably disposed in a dielectric bushing 444. Each of the lift pins 442 may be formed from a ceramic material, such as AlN, sapphire, quartz, or the like. The dielectric bushing 444 is provided in or through each of the puck 400, the dielectric plate 410 and the base plate 415. The dielectric bushing 444 is made of a polymer material, such as a polytetrafluoroethylene (PTFE) material. The dielectric bushing 444 includes an opening 446 along the length direction thereof where the lift pin 442 is guided. The opening 446 is sized slightly larger than the dimension (diameter) of the lift pin 442 such that a conductance path is formed in the dielectric bushing 444. For example, the opening 446 is coupled to the variable pressure system 120 such that vacuum conductance is provided between the processing volume 160 and through the dielectric bushing 444 to the variable pressure system 120. The conductance path provided by the opening 446 prevents arcing of the lift pins. The dielectric bushing 444 includes a plurality of steps 448 which are varied diameter sections. The steps 448 reduce arcing between the puck 400 and the base plate 415 by increasing the length of the path electricity may travel, as well as by introducing angular turns along the path.

The substrate support 115 also includes a plurality of fastener devices 450 (only one shown). The fastener devices 450 are utilized to attach the puck 400 to the dielectric plate 410. Each fastener device 450 includes a fastener 452, a metallic washer 454 and a fastener cap 456. When the fastener 456 is tightened, the washer 454 is urged against a surface 458 of an opening 460 formed in the dielectric plate 410. The washer 454 and the fastener 452 are made from a metallic material, such as stainless steel. The washer 454 includes a rounded upper corner. The rounded upper corner prevents cracking of the material of the dielectric plate 410 when the fastener 452 is tightened.

The fastener cap 456 is utilized to fill the remainder of the opening 460 in the dielectric plate 410. The fastener cap 456 includes a pocket 464 that is sized to receive the head of the fastener 452. The fastener cap 456 is formed from a dielectric material, such as a polymer, for example, polyether ether ketone (PEEK). The outer surface of the fastener cap 456 includes a step, which reduces arcing between the puck 400 and the base plate 415 by increasing the length of the path electricity may travel.

The substrate support 115 also includes a plurality of gaps between layers thereof. A first gap 470 is provided between the puck 400 and the dielectric plate 410. A second gap 472 is provided between the dielectric plate 410 and the base plate 415. The first gap 470 and the second gap 472 are in fluid communication with the gas supply 325 shown and described in FIGS. 3A and 3B. Fluids from the gas supply 325 are flowed in the first gap 470 and the second gap 472 to prevent condensation between adjacent layers. Fluids in the first gap 470 and the second gap 472 are sealed on ends of the substrate support 115 by the insulator ring 420. The insulator ring 420 may be sized to provide a controlled leakage of fluids from the first gap 470 and the second gap 472. The insulator ring 420 may comprise an insulating material, such as silicon oxide.

At least the puck 400 and the dielectric plate 410 are surrounded by an insulator ring 420. The base plate 415 and a portion of the insulator ring 420 are surrounded by a ground ring 425 made of aluminum, or another electrically conductive material. The insulator ring 420 may include or more extensions (not shown), which reduce "line of sight" of RF current flow by inducing angular turns. The inclusion of the angular turns, as shown, of the cross-sectional shape reduces arcing of RF current. The insulator ring 420 prevents or minimizes arcing between the puck 400 and the base plate 415 during operation.

An edge ring 422 is disposed adjacent to an inner circumference of the insulator ring 420. The edge ring 422 may comprise a dielectric material, such as quartz, silicon, cross-linked polystyrene and divinylbenzene (e.g., Rexolite®), PEEK, $Al_2O_3$, AlN, among others. Utilizing an edge ring 422 comprising such a dielectric material helps modulate the plasma coupling, modulating the plasma properties, such as the voltage on the substrate support ($V_{dc}$), without having to change the plasma power, thus improving the properties of the hardmask films deposited on substrates. By modulating the RF coupling to the wafer or substrate through the material of the edge ring 422, the modulus of the film can be decoupled from the stress of the film. As such, the stress of the hardmask may be reduced without impacting the modulus, or the modulus of the hardmask may be improved without impacting the stress, without having to modulate ion energy by scaling up the RF power.

Conventionally, adjustments to the modulus or the stress of the film were achieved by adjusting the RF power utilized to ignite and/or maintain a plasma in the processing chamber. By changing the RF power, a resulting change in film modulus and stress can be achieved. However, changes in RF power affect both the film modulus and the film stress simultaneously. Therefore, conventionally, an intentional change to film modulus may also result in an unintentional change to film stress, or vice versa.

In contrast, it has been unexpectedly discovered that changes in the edge ring material can effect a change in film modulus without affecting film stress, or vice versa. Not wishing to be bound by theory, it is believed this accomplished as a result of a change in RF coupling to the substrate, caused by varying properties of edge rings formed of different materials. Moreover, changing the RF coupling to the substrate without changing the RF power applied to generate/maintain the plasma allows a single property (e.g., one of modulus or stress) to be adjusted without significantly impacting another property (such as the other of modulus or stress).

Typically, only one RF source is primarily utilized during deposition, and in order to increase $V_{dc}$, plasma power (or pressure) is increased, which increases both ion-density (i.e., greater ionization at higher powers) and ion-energy due to the higher $V_{dc}$. As such, stress and modulus are unable to be independently adjusted or modified. However, by changing the material of the edge ring 422, the $V_{dc}$ on the substrate is increased without impact the plasma ionization. Thus, properties such as stress and modulus are able to be adjusted or modified independently. For example, when comparing a first edge ring comprising $Al_2O_3$ to a second edge ring comprising quartz, both the $Al_2O_3$ edge ring and the quartz edge ring result in films having the same modulus; however, the quartz edge ring results in films having significantly less stress than the $Al_2O_3$ edge ring.

By utilizing the edge ring 422 having a lower dielectric constant disposed between the plasma, which acts as a conductor at a plasma potential, and the ground, the capacitance between plasma and the ground can be modulated. As such, the electric field between the plasma and the ground is reduced, modulating the ion flux to the ground. The edge ring 422 having a lower dielectric constant and the ion flux being modulated to ground enhances or strengthens the electric field, which in turn enhances both the $V_{dc}$ and the ion energy on the substrate. Thus, the ion energy on the substrate is enhanced without the need for any increase in ion and neutral density that would occur if the RF power was increased. The enhanced $V_{dc}$ and ion energy on the substrate without an increase in RF power enables the stress and modulus of the substrate to be independently adjusted.

Figure 5:
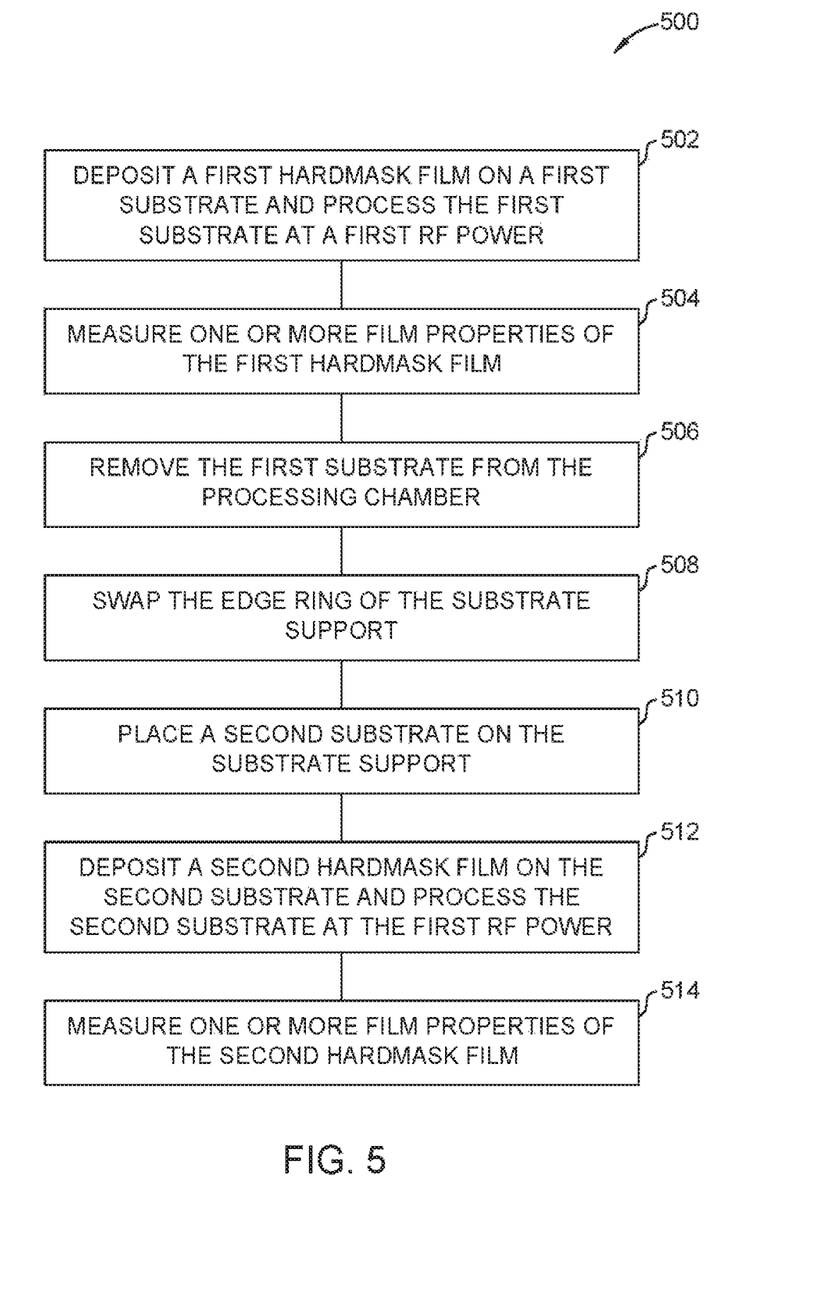
FIG. 5 illustrates a method of utilizing the edge ring to modulate the properties of a carbon hardmask film, according to one embodiment.

FIG. 5 illustrates a method 500 of utilizing the edge ring to modulate the properties of a hardmask film, according to one embodiment. The method 500 may be utilized with the processing chamber 100 of FIGS. 1-3, including the system controller 101, and the substrate support 115 of FIG. 4.

In operation 502, after a first substrate is placed in the process chamber, a first hardmask film is deposited on the first substrate, and the first substrate is processed at a first RF power. In operation 504, one or more film properties of the first hardmask film are measured. The one or more film properties include at least film stress and film modulus. In operation 506, the first substrate is removed from the substrate support and processing chamber.

In operation 508, a first edge ring of the substrate support is swapped for a second edge ring comprising a dielectric material, such as quartz, silicon, cross-linked polystyrene and divinylbenzene (e.g., Rexolite®), PEEK, $Al_2O_3$, or AlN. The second edge ring may be the edge ring 422 of FIG. 4. The second edge ring may have a lower dielectric constant than the first edge ring. Alternatively, the second edge ring may have a higher dielectric constant than the first edge ring. The second edge ring comprising such a dielectric material helps modulate the plasma coupling, modulating the plasma properties without having to change the plasma power, thus improving the properties of the hardmask film deposited on substrates. In one example, the second edge ring is selected to adjust a property, such as a modulus or stress, as a result of measurements of the first hardmask film. For example, if it is determined that the modulus of the first hardmask film is not within a predetermined range (but the stress is within a predetermined range), the second edge ring is selected such that the modulus of subsequently-deposited films is adjusted to be within a predetermined range, while stress also remains in a previously-determined range.

In operation 510, a second substrate is then placed on the substrate support. In operation 512, a second hardmask film is deposited on the second substrate, and the second substrate is processed at the first RF power. Thus, both the first substrate and the second substrate are processed at the same RF power within the same processing chamber.

In operation 514, one or more film properties of the second hardmask film are measured. The one or more film properties include at least film stress and film modulus. The film properties of the second hardmask film are then compared to the film properties of the first hardmask film to confirm the desired amount of adjustment between the first hardmask film and the second hardmask film has been achieved. The second hardmask film may have a change in modulus different than the first hardmask film of at least about 20%. The second hardmask film may have a change in stress different than the first hardmask film of less than about 5%. Alternatively, the second hardmask film may have a change in stress different than the first hardmask film of at least about 20%, and the second hardmask film may have a change in modulus different than the first hardmask film of less than about 5%. Thus, while the first and second substrates were processed at the same RF power, the film quality of the second hardmask film disposed on the second substrate is greater than the film quality of the first hardmask disposed on the first substrate, as a result of changing the material of the edge ring, and without any other changes to processing recipe/parameters.

By modulating the RF coupling to the substrate through the material of the edge ring, the inverse relationship between modulus and stress can be broken (i.e., decouple the modulus from the stress). As such, the stress of the hardmask may be reduced without impacting the modulus, or the modulus of the hardmask may be improved without impacting the stress. Furthermore, the film properties of the hardmask are improved without modulating ion energy by scaling up the RF power.

Utilizing an edge ring comprising a dielectric material such as quartz, silicon, cross-linked polystyrene and divinylbenzene (e.g., Rexolite®), PEEK, $Al_2O_3$, or AlN, enables deposited hardmask films to have both higher modulus and lower stress. Since the hardmask films are deposited to have higher modulus and lower stress through utilization of the edge ring, other components of the system are no longer required to handle an increased workload due to an increasing RF current and voltage, increasing the lifespan of the components by preventing the components from breaking down.

While the foregoing is directed to embodiments of the present disclosure, other and further embodiments of the disclosure can be devised without departing from the basic scope thereof, and the scope thereof is determined by the claims that follow.

What is claimed is:

1. A method for modulating properties of one or more hardmask films, comprising:
    depositing a first hardmask film on a first substrate and processing the first substrate at a first RF power;
    measuring one or more film properties of the first hardmask film;
    removing the first substrate from a substrate support;
    swapping a first edge ring in the substrate support for a second edge ring, the second edge ring comprising a material selected from the group consisting of quartz, silicon, cross-linked polystyrene and divinylbenzene, polyether ether ketone, $Al_2O_3$, and AlN;
    placing a second substrate on the substrate support;
    depositing a second hardmask film on the second substrate and processing the second substrate at the first RF power; and
    measuring the one or more film properties of the second hardmask film.

2. The method of claim 1, wherein the second hardmask film has a change in modulus different than the first hardmask film of at least about 20%, and wherein the second hardmask film has a change in stress different than the first hardmask film of less than about 5%.

3. The method of claim 1, wherein the second hardmask film has a change in stress different than the first hardmask film of at least about 20%, and wherein the second hardmask film has a change in modulus different than the first hardmask film of less than about 5%.

4. The method of claim 1, wherein the first edge ring comprises a different material than the second edge ring, and the first hardmask material is the same as the second hardmask material.

5. The method of claim 1, wherein the second edge ring has a lower dielectric constant than the first edge ring.

6. The method of claim 1, wherein the material of the second edge ring increases a voltage and an ion energy on the second substrate when the first RF power is applied.

7. The method of claim 1, wherein the one or more film properties comprise modulus and stress, and wherein the material of the second edge ring is selected to independently adjust the modulus and the stress of the second hardmask film.

8. A method for modulating properties of one or more hardmask films, comprising:
    depositing a first hardmask film on a first substrate and processing the first substrate at a first RF power;
    measuring one or more film properties of the first hardmask film, the one or more film properties comprising modulus and stress;
    removing the first substrate from a substrate support;
    swapping a first edge ring in the substrate support for a second edge ring, the first edge ring comprising a first material different than a second material of the second edge ring;
    placing a second substrate on the substrate support; and
    depositing a second hardmask film on the second substrate and processing the second substrate at the first RF power, wherein the second material of the second edge ring is selected to adjust at least one film property of the second hardmask film based on the measured one or more film properties of the first hardmask film.

9. The method of claim 8, wherein the dielectric material of the second edge ring is selected from the group consisting of quartz, silicon, cross-linked polystyrene and divinylbenzene, polyether ether ketone, $Al_2O_3$, and AlN.

10. The method of claim 8, wherein the second hardmask film has a change in modulus different than the first hardmask film of at least about 20%, and wherein the second hardmask film has a change in stress different than the first hardmask film of less than about 5%.

11. The method of claim 8, wherein the second hardmask film has a change in stress different than the first hardmask film of at least about 20%, and wherein the second hardmask film has a change in modulus different than the first hardmask film of less than about 5%.

12. The method of claim 8, wherein the second edge ring has a higher dielectric constant than the first edge ring.

13. The method of claim 8, wherein the material of the second edge ring increases a voltage and an ion energy on the second substrate when the first RF power is applied.

14. The method of claim 8, wherein the second material of the second edge ring is selected to independently adjust a modulus and a stress of the second hardmask film.

15. A non-transitory computer-readable medium having instructions that are configured to cause a system to:
- deposit a first hardmask film on a first substrate and processing the first substrate at a first RF power;
- measure one or more film properties of the first hardmask film;
- remove the first substrate from a substrate support;
- swap a first edge ring in the substrate support for a second edge ring, the second edge ring comprising a material selected from the group consisting of quartz, silicon, cross-linked polystyrene and divinylbenzene, polyether ether ketone, $Al_2O_3$, and AlN;
- place a second substrate on the substrate support;
- deposit a second hardmask film on the second substrate and processing the second substrate at the first RF power; and
- measure the one or more film properties of the second hardmask film.

16. The non-transitory computer-readable medium of claim 15, wherein the second hardmask film has a change in modulus different than the first hardmask film of at least about 20%, and wherein the second hardmask film has a change in stress different than the first hardmask film of less than about 5%.

17. The non-transitory computer-readable medium of claim 15, wherein the second hardmask film has a change in stress different than the first hardmask film of at least about 20%, and wherein the second hardmask film has a change in modulus different than the first hardmask film of less than about 5%.

18. The non-transitory computer-readable medium of claim 15, wherein the one or more film properties comprise modulus and stress, and wherein the material of the second edge ring is selected to independently adjust the modulus and the stress of the second hardmask film.

19. The non-transitory computer-readable medium of claim 15, wherein the second edge ring has a lower dielectric constant than the first edge ring.

20. The non-transitory computer-readable medium of claim 15, wherein the material of the second edge ring increases a voltage and an ion energy on the second substrate when the first RF power is applied.

* * * * *